US008917566B2

(12) United States Patent
Cummings et al.

(10) Patent No.: US 8,917,566 B2

(45) Date of Patent: Dec. 23, 2014

(54) BYPASS STRUCTURE FOR A MEMORY DEVICE AND METHOD TO REDUCE UNKNOWN TEST VALUES

(75) Inventors: Aaron J. Cummings, Williston, VT (US); Michael T. Fragano, Essex Junction, VT (US); Kevin W. Gorman, Essex, VT (US); Kelly A. Ockunzzi, Williston, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 13/444,229

(22) Filed: Apr. 11, 2012

(65) Prior Publication Data

US 2013/0272072 A1 Oct. 17, 2013

(51) Int. Cl.
*G11C 7/00* (2006.01)

(52) U.S. Cl.
USPC ....................... 365/201; 365/194; 365/233.11

(58) Field of Classification Search
CPC ............... G11C 2029/0405; G11C 2029/3202; G11C 11/41; G11C 15/00; G11C 29/02; G11C 29/022; G11C 29/12; G11C 29/14; G11C 29/32; G11C 5/063; G11C 11/4076; G11C 29/12005; G11C 5/145
USPC .......... 365/194, 201, 189.03, 189.04, 189.06, 365/189.08, 233.11, 233.1, 233.12, 233.13, 365/233.14
See application file for complete search history.

(56) References Cited

U.S. PATENT DOCUMENTS 5,925,143 A 7/1999 Gillis et al.
7,152,194 B2 12/2006 Vinke et al.
7,283,404 B2 10/2007 Khan et al.
7,751,266 B2 7/2010 Adams et al.
7,797,591 B2 9/2010 Hasegawa et al.
7,930,601 B2 4/2011 Eckelman et al.
2005/0039095 A1 2/2005 Guettaf
2011/0004793 A1* 1/2011 Sul et al. ...................... 714/718
2011/0307747 A1* 12/2011 Duffy et al. .................. 714/718

FOREIGN PATENT DOCUMENTS

EP 1168369 B1 8/2003
JP 2009245336 A 10/2009

* cited by examiner

*Primary Examiner* — Hien Nguyen
(74) *Attorney, Agent, or Firm* — David A. Cain; Hoffman Warnick LLC

(57) ABSTRACT

Aspects of the invention provide a bypass structure for a memory device for reducing unknown test values, and a related method. In one embodiment, a bypass structure for a memory device is disclosed. The bypass structure includes: a logic gate configured to receive a test signal and a clock signal; and an output latch configured to receive an output of the logic gate, an output of the memory device, and a bypass data signal, wherein the output latch is configured to hold the bypass data signal and bypass the output of the memory device in response to asserting the test signal, such that unknown data from the output of the memory device is bypassed.

20 Claims, 5 Drawing Sheets

BYPASS STRUCTURE FOR A MEMORY DEVICE AND METHOD TO REDUCE UNKNOWN TEST VALUES

FIELD OF THE INVENTION

The disclosure relates generally to memory devices, and more particularly, to a bypass structure for a memory device for reducing unknown test values, and a related method.

BACKGROUND

For automatic logic test pattern generation in manufacturing tests, the inputs and outputs of random access memories (RAMs) are exercised at speed to ensure that there are no delay faults on the logic paths into and out of the RAMs. During the tests, the contents of the RAMs on a chip are generally assumed to be unknown. Otherwise, the test generator would require extra processor time and memory to compute and remember RAM contents from one test sequence to the next, and the test sequences could not be reordered or applied individually at the tester. Typically for logic tests, the RAMs are put in a bypass mode so known, predictable data is launched from the RAM outputs.

However, to exercise the logic paths into and out of the RAMs, the bypass mode cannot be used. The RAMs must be in a functional mode so the tests can write to and read from the memories. The initial, unknown data, frequently called "X states," that is outputted from the RAMs cannot be compressed into a verifiable signature, since the data is unknown.

BRIEF SUMMARY

Aspects of the invention provide a bypass structure for a memory device for reducing unknown test values, and a related method. In one embodiment, a bypass structure for a memory device is disclosed. The bypass structure includes: a logic gate configured to receive a test signal and a clock signal; and an output latch configured to receive an output of the logic gate, an output of the memory device, and a bypass data signal, wherein the output latch is configured to hold the bypass data signal and bypass the output of the memory device in response to asserting the test signal, such that unknown data from the output of the memory device is bypassed.

A first aspect of the disclosure provides a bypass structure for a memory device, the bypass structure comprising: a logic gate configured to receive a test signal and a clock signal; and an output latch configured to receive an output of the logic gate, an output of the memory device, and a bypass data signal, wherein the output latch is configured to hold the bypass data signal and bypass the output of the memory device in response to asserting the test signal, such that unknown data from the output of the memory device is bypassed.

A second aspect of the disclosure provides a circuit, comprising: a memory device; and a bypass structure downstream of the memory device, the bypass structure comprising: a logic gate configured to receive a test signal and a clock signal; and an output latch configured to receive an output of the logic gate, an output of the memory device, and a bypass data signal, wherein the output latch is configured to hold the bypass data signal and bypass the output of the memory device in response to asserting the test signal, such that unknown data from the output of the memory device is bypassed.

A third aspect of the disclosure provides a method of reducing unknown data from a memory device, the method comprising: providing a memory device and a downstream bypass structure, the bypass structure comprising: a logic gate configured to receive a test signal and a clock signal; and an output latch configured to receive an output of the logic gate, an output of the memory device, and a bypass data signal; asserting the test signal, such that the output latch bypasses the output of the memory device and holds the bypass data signal; and de-asserting the test signal, such that the output latch continues to hold the bypass data signal.

BRIEF DESCRIPTION OF THE DRAWINGS

The above and other aspects, features and advantages of the disclosure will be better understood by reading the following more particular description of the disclosure in conjunction with the accompanying drawings.

Figure 1:
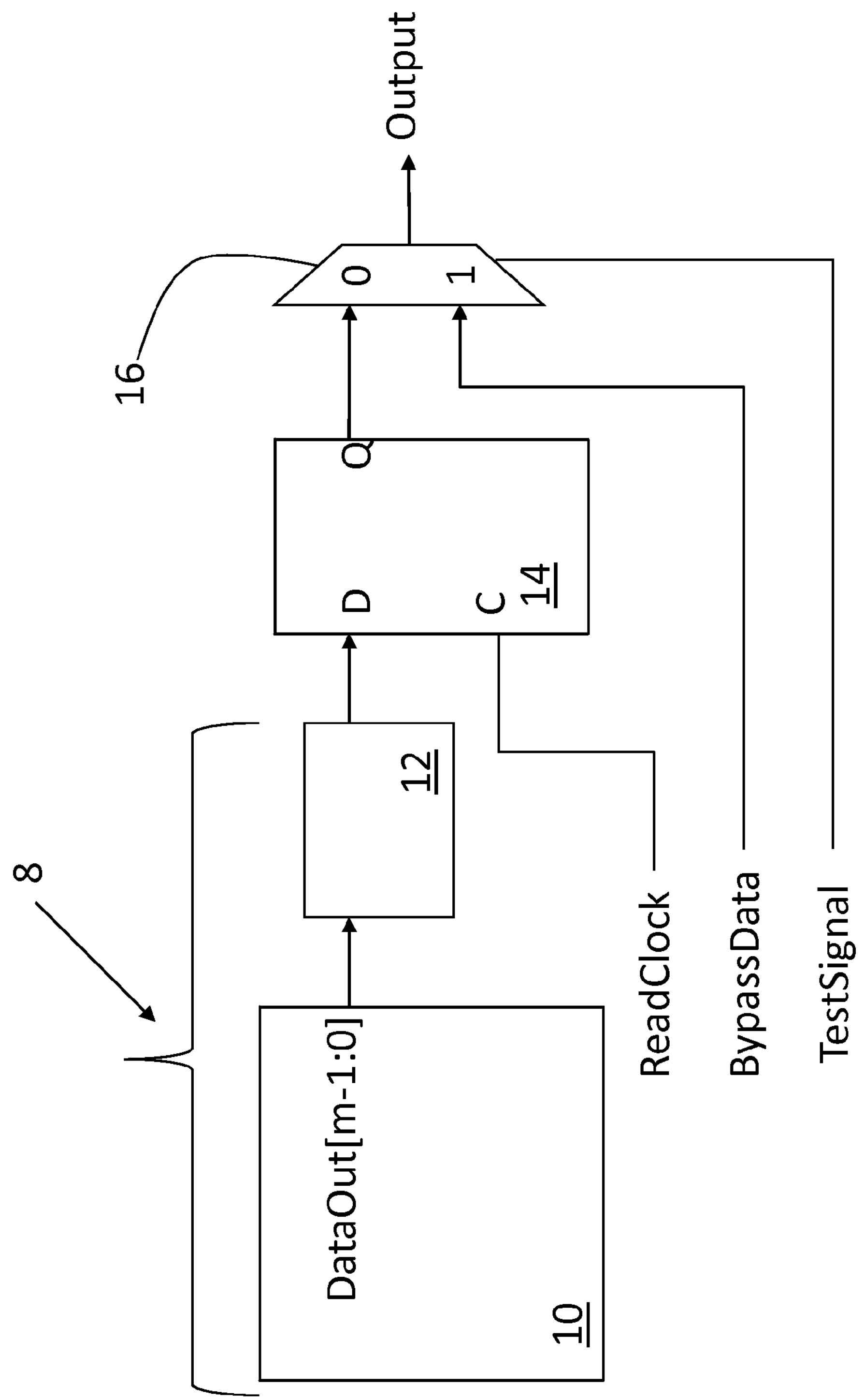
FIG. 1 shows a block diagram of a prior art memory device output path.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

The disclosure relates generally to memory devices, and more particularly, to a bypass structure for a memory device for reducing unknown test values, and a related method.

As mentioned above, for automatic logic test pattern generation in manufacturing tests, the inputs and outputs of random access memories (RAMs) are exercised at speed to ensure that there are no delay faults on the logic paths into and out of the RAMs. During the tests, the contents of the RAMs on a chip are generally assumed to be unknown. Otherwise, the test generator would require extra processor time and memory to compute and remember RAM contents from one test sequence to the next, and the test sequences could not be reordered or applied individually at the tester. Typically for logic tests, the RAMs are put in a bypass mode so known, predictable data is launched from the RAM outputs.

However, to exercise the logic paths into and out of the RAMs, the bypass mode cannot be used. The RAMs must be in a functional mode so the tests can write to and read from the memories. The initial, unknown data, frequently called "X states," that is outputted from the RAMs cannot be compressed into a verifiable signature, since the data is unknown. Unknown "X" states or data are a problem because they reduce the effectiveness of on-product multi-input signature register (OPMISR) techniques that reduce test data volume. OPMISR techniques can tolerate a few unknown "X" states by masking out the unknown values, but as the number of X-states increases, the amount of masking increases. This increases the chances that good, non-X state, data is masked.

If too many X-states are outputted from a memory device, OPMISR techniques cannot be used.

Turning to FIG. 1, a block diagram of a prior art RAM output path is shown. A memory device 8, or RAM, may include a plurality of array cells 10 and a sense amplifier 12. A latch 14 receives the output of the memory device 8. The output of the latch 14 is fed to a multiplexer 16, which drives any downstream logic (i.e., flip-flops) (not shown).

When generating test patterns (i.e., "TestSignal"), if "TestSignal" is asserted as a "1", "BypassData" (from an upstream flip-flop) is passed through multiplexer 16. If "TestSignal" is asserted as a "0", the output of latch 14 is passed through multiplexer 16. However, in order to read and write to the memory device 8, "TestSignal" must be asserted as a "0." When write and read operations are initially performed on the memory device 8, in order to test the path through memory device 8, the output of the memory device 8 is initially unknown. Therefore, unknown "X" values will be passed through the multiplexer 16 (since "TestSignal" is asserted as a "0").

Several attempts may be made to ensure that unknown "X" values are not passed through from the memory device 8. For example, one attempt includes inserting, into each test sequence, a scan load of the chip after valid data is available at the memory device outputs. Downstream flip-flops capture the X-states during write and read operations. After the read operations, valid data is available at the RAM outputs. At this point, turning to FIG. 1, "TestSignal" is asserted as "1" to prevent any more writes or reads, preserving the array data, and the scan load removes all X-states by re-loading the downstream flip-flops with known data. Then, "TestSignal" is asserted as a "0" and the known data from the memory device may be captured in a downstream flip-flop. However, an extra scan load increases test data volume and doubles the test application time.

Other attempts do not include additional time for testing, but complicate the circuit. For example, one attempt includes enabling the memory device to write and read, but continue to select "BypassData" to pass through the multiplexer, until known, valid data is available at the memory device output. A new test signal is added as a primary input of the chip, which separately controls the write and read operations to the memory device, while "TestSignal", as shown in FIG. 1, only controls the output of the multiplexer 16. This attempt requires a test generator to understand how to control this new test signal and the "TestSignal" shown in FIG. 1 at-speed.

Another attempt includes an additional clock signal that drives the memory device, separate from the clock signal that drives the downstream logic (flip-flops). The clock signal that drives the downstream logic would be held off, and asserted as a "0" until valid data is ready to be observed from the output of the memory device. However, customers would not want to be required to add a separate clock, since both these clocks would need to be timed correctly in order to function properly.

Aspects of the invention provide a bypass structure for a memory device for reducing unknown test values, and a related method. In one embodiment, a bypass structure for a memory device is disclosed. The bypass structure includes: a logic gate configured to receive a test signal and a clock signal; and an output latch configured to receive an output of the logic gate, an output of the memory device, and a bypass data signal, wherein the output latch is configured to hold the bypass data signal and bypass the output of the memory device in response to asserting the test signal, such that unknown data from the output of the memory device is bypassed.

Figure 2:
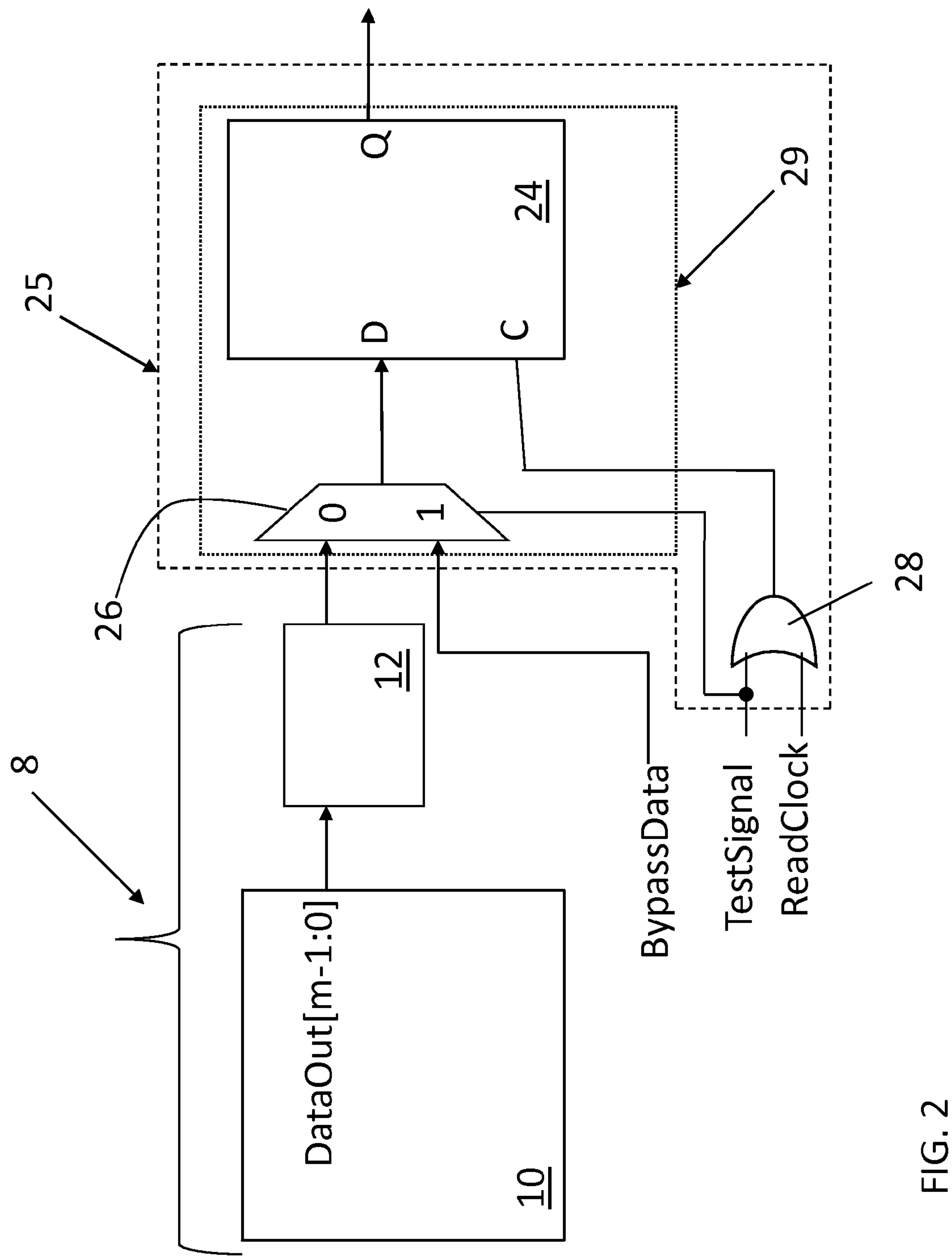
FIG. 2 shows a block diagram of a memory device output path according to embodiments of the invention.

Turning to FIG. 2, a block diagram of a memory device output path is shown. Memory device 8 of FIG. 1 is identical to memory device 8 shown in FIG. 2. As such, memory device 8 includes a plurality of array cells 10 and a sense amplifier 12, as known in the art. A bypass structure 25 is positioned downstream of the memory device 8. Bypass structure 25 includes a logic gate 28 (shown as an "OR" gate) and an output latch 29. In this embodiment, output latch 29 includes a multiplexer 26 and a latch 24 that is positioned downstream of the multiplexer 26.

Logic gate 28 is configured to receive "TestSignal" and a "ReadClock" signal. The output latch 29 is configured to receive an output of the logic gate 28 (into input "C" of latch 24), an output of the memory device 8 (e.g., into input "0" of multiplexer 26), and "BypassData" (e.g., into input "1" of multiplexer 26). Output latch 29, at multiplexer 26, also receives "TestSignal", which controls the output of the multiplexer 26. For example, if "TestSignal" is asserted as a "1", "BypassData" would be outputted from the multiplexer 26. If "TestSignal" is asserted as a "0", the output of the memory device 8 would be outputted from the multiplexer 26.

The "D" input of latch 24 receives the output of the multiplexer 26. If the "C" input of latch 24 (from the output of the logic gate 28) is asserted as a "1", then latch 24 will accept and hold the value of the input at "D," and output this value at "Q". Otherwise, latch 24 will ignore the input at "D" and will continue to output at "Q" the value it is currently holding.

In this embodiment shown in FIG. 2, unknown data values that are in memory device 8 will not be outputted by bypass structure 25. When "TestSignal" is asserted as a "1," the multiplexer 26 will only output "BypassData" into latch 24, which will be accepted and held by latch 24, since the output of logic gate 28 is a "1." While "TestSignal" is asserted as a "1," the unknown data values from memory device 8 will be bypassed by multiplexer 26.

Once the unknown data values are bypassed by the multiplexer 26, "TestSignal" is de-asserted and changed to a "0." Regardless of the output of multiplexer 26, latch 24 will continue to hold "BypassData" since the output of logic gate 28 is "0" ("TestSignal" is "0" and "ReadClock" is held at "0"). When a valid read of the memory device 8 is performed, "ReadClock" is asserted to a "1" and the output of the memory device 8 (the known data values) is passed through and held on latch 24. In this configuration, no additional test signals, clock signals, or inputs are needed to bypass the unknown data values in memory device 8.

This configuration in FIG. 2, as well as the configurations shown in FIGS. 3 and 4, which will be discussed herein, also simplifies the testing of transition faults on the output, "Q", of the bypass structure 25. A tester will want to test the slow-to-rise fault (a transition from "0" to "1") and the slow-to-fall fault (a transition from "1" to "0") at output Q. In this configuration, only one write operation and one read operation is required to test this transition fault. For example, latch 24 is initialized with stale data (i.e., BypassData) ("0" for a slow-to-rise fault and "1" for a slow-to-fall fault) by asserting "TestSignal" to a "1." Latch 24 then holds the stale data when "TestSignal" is de-asserted to a "0." A write operation writes new data to memory device 8 ("1" for slow-to-rise fault and "0" for slow-to-fall fault). A first clock pulse loads a downstream flip-flop (not shown) with the stale data. Concurrently with the first clock pulse, a read operation reads the new data in memory device 8 into latch 24. A second clock pulse loads the new data from latch 24 into the downstream flip-flop (not shown). In contrast, the prior art configuration shown in FIG. 1 would require two write operations and two read operations to test this transition fault at the output "Q." The additional write and read operations are needed to initialize latch 14 by writing the stale data to memory device 8 and then reading the stale data into latch 14.

This configuration in FIG. 2, as well as the configurations shown in FIGS. 3 and 4, which will be discussed herein, also simplifies the logic required when the output "Q" drives an input of a second memory device (not shown). That is, transition faults at the input of a memory device may be tested. This second memory device (not shown) could be memory device 8, or a different memory device. In this configuration, latch 24 of the bypass structure 25 may drive a downstream flip-flop (not shown), which drives the inputs of the downstream memory device (not shown). A scan load with "TestSignal" asserted to "1" initializes latch 24 with new data (i.e., "BypassData") and initializes the downstream flip-flop (not shown) with the stale data. Latch 24 then holds the new data when "TestSignal" is de-asserted to "0." A first clock pulse loads the downstream memory device (not shown) with the stale data from the flip-flop and loads the flip-flop with the new data from latch 24. A second clock pulse loads the downstream memory device (not shown) with the new data from the flip-flop (not shown). Only one downstream flip-flop is required to test the transition faults at the input of the downstream memory device. In contrast, the prior art configuration shown in FIG. 1 would require two downstream flip-flops between the memory devices, one to hold the stale data and one to hold the new data.

Figure 3:
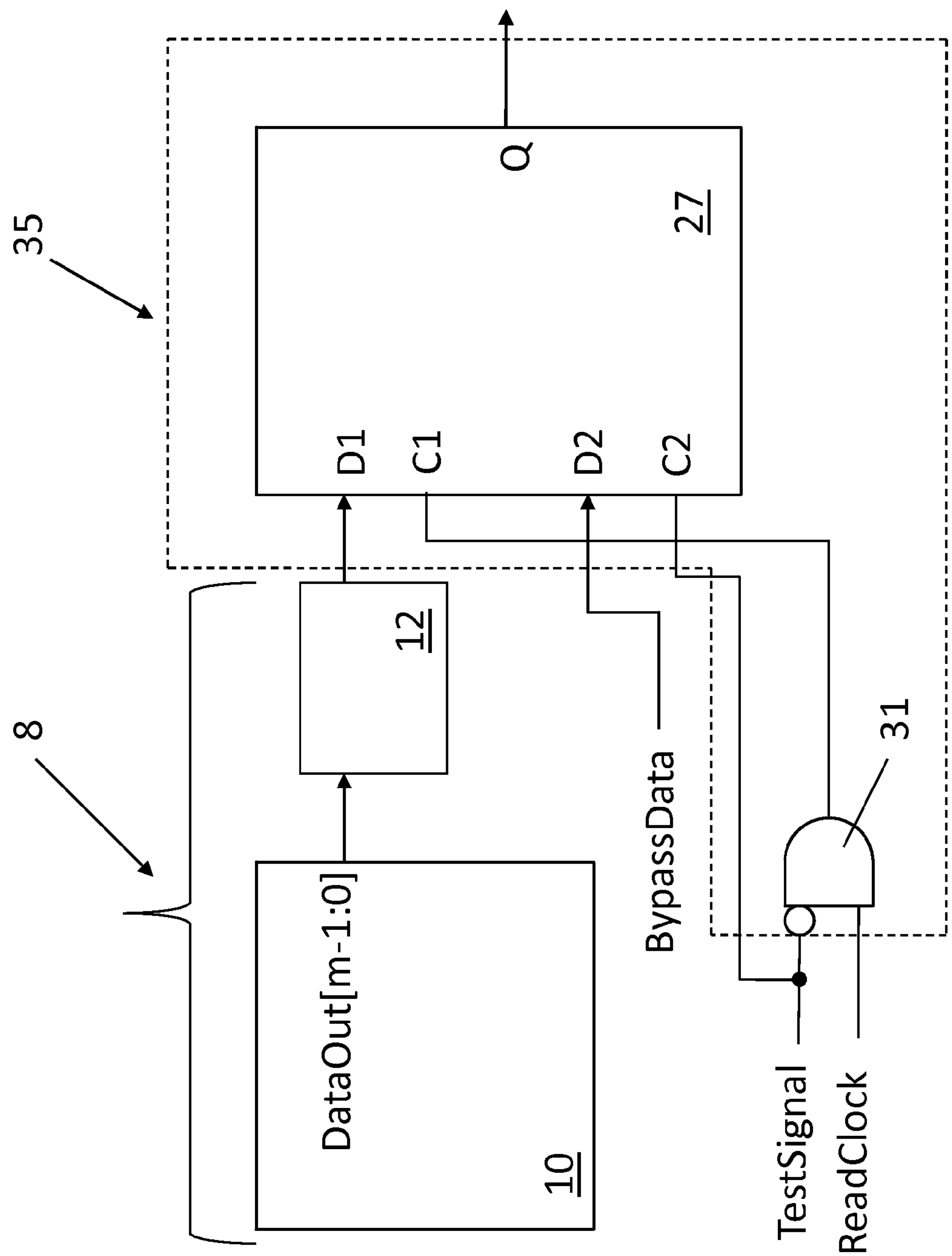
FIG. 3 shows a block diagram of a memory device output path according to embodiments of the invention.

Turning now to FIG. 3, a block diagram of a memory device output path according to embodiments of the invention is shown. In this embodiment, output latch 35 includes a two-port latch 27. Further, logic gate 31 is an "AND" gate with an inverter at the input from the "TestSignal." The two-port latch 27 has two data inputs, "D1" and "D2," and two control inputs, "C1" and "C2." The output, "Q," of the two-port latch 27 will be either "D1" or "D2," depending on the values of "C1" and "C2." "C1" and "C2" cannot be asserted (e.g., held at "1") simultaneously.

In this embodiment, "TestSignal" is asserted to a "1," which asserts control input "C2" of the two-port latch 27. Therefore, the output, "Q," of the two-port latch 27 will be "BypassData" (data input D2). Since control input "C1" is held at "0," any unknown data values from the memory device 8 (at data input "D1") will not be held by the two-port latch 27.

Then, "TestSignal" may be de-asserted (e.g., held at "0"), which de-asserts control input "C2" ("0") of two-port latch 27. However, the two-port latch 27 will continue to hold the value of "BypassData" until control input "C1" of the two-port latch 27 is asserted ("1"). Once a valid read of memory device 8 is performed, "ReadClock" will be asserted ("1") and the output of logic gate 31 will assert the control input "C1" of the two-port latch 27. The output of the memory device 8 (the known data values) are inputted into data input "D1" and held by the two-port latch 27. Similar to the embodiment shown in FIG. 2, unknown data values from the memory device 8 are not passed to the bypass structure 35. Rather, while unknown data values are output from the memory device 8, the bypass structure 35 holds the "BypassData," and only when a valid read of the memory device 8 is performed (when known data values are read from memory device 8), does the bypass structure 35 hold the output of the memory device 8.

Figure 4:
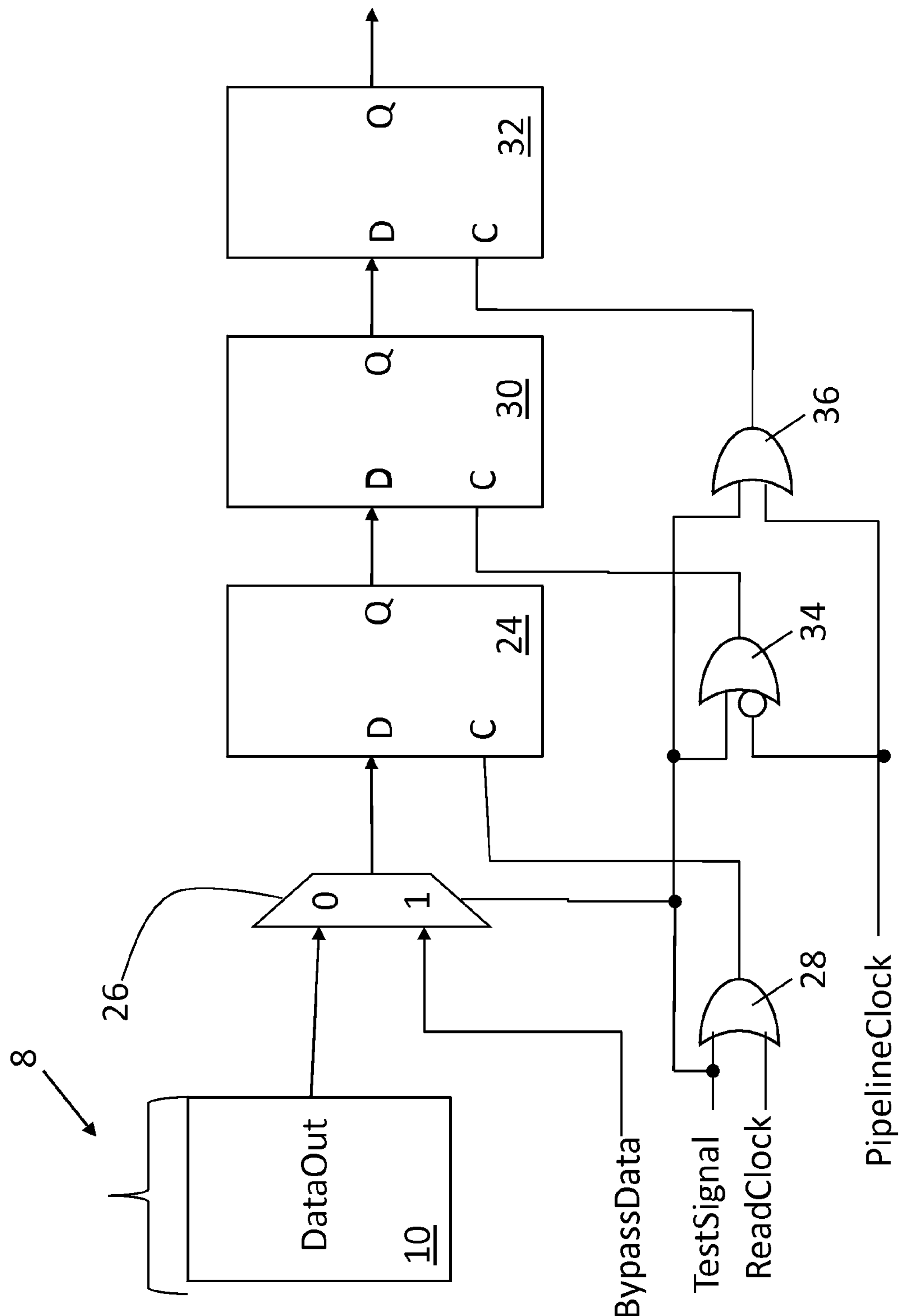
FIG. 4 shows a block diagram of a memory device output path according to embodiments of the invention.

Turning now to FIG. 4, a block diagram of a memory device output path according to embodiments of the invention is shown. This embodiment is similar to the embodiment shown in FIG. 2. However, it is understood that this embodiment may also be applied to the embodiment shown in FIG. 3. Further, it is noted that sense amplifier 12 is not shown in this embodiment for clarity purposes only, and it is understood that memory device 8 still includes a sense amplifier 12.

In this embodiment, additional downstream logic is added to latch 24. That is, a pipeline of latches 30, 32 are provided. In a pipeline of latches, the data passes through a plurality of latches 30, 32 before it is outputted. The pipeline of latches 30, 32 flushes the "BypassData" when "TestSignal" is asserted to "1" and holds the "BypassData" when "TestSignal" is de-asserted at "0" after a scan load. The data in the pipeline latches 30, 32 is always known, since the data in hold latch 24 is always known.

That is, the output of latch 24 is received by the data input "D" of latch 30. Further, the output of latch 30 is received by the data input "D" of latch 32. Although only two additional pipeline latches 30, 32 are shown in FIG. 4, it is understood that any number of additional pipeline latches may be utilized. Further, additional logic gates 34, 36 are used to control the output of latches 30, 32 with the "PipelineClock."

Since unknown data values are bypassed by bypass structures 25, 35, extra scan loads are not needed to remove the unknown data values from the scan chain, which saves test data volume and test application time. There is no need for an additional test signal or clock to be allocated and controlled. The test generator can assume that the contents of memory device 8 are unknown at the beginning of each test sequence, saving processor time and memory.

Figure 5:
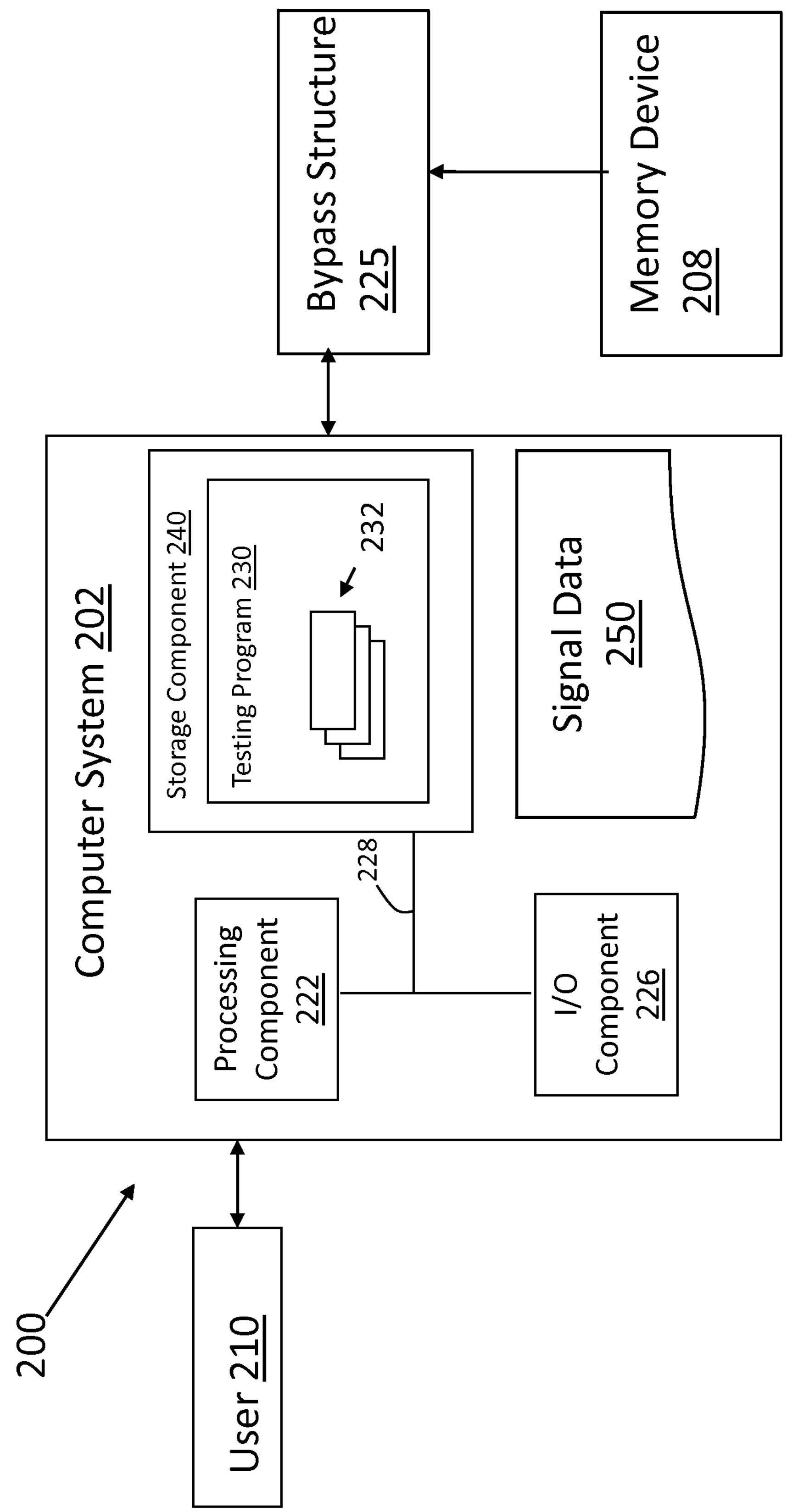
FIG. 5 shows an illustrative environment according to embodiments of the invention.

Turning now to FIG. 5, an illustrative environment 200 for reducing unknown values from a memory device 208 according to embodiments of the invention is shown. To this extent, environment 200 includes a computer system 202 that can perform a process described herein in order to reduce unknown values from a memory device 208 during manufacturing testing of the memory device 208. In particular, computer system 202 is shown including a testing program 230, which makes computer system 202 operable to reduce unknown values from a memory device 208 during manufacturing testing of memory device 208 by performing the process described above with respect to FIGS. 2-4.

Computer system 202 is shown including a processing component 222 (e.g., one or more processors), a storage component 240 (e.g., a storage hierarchy), an input/output (I/O) component 226 (e.g., one or more I/O interfaces and/or devices), and a communications pathway 228. In general, processing component 222 executes program code, such as testing program 230, which is at least partially fixed in storage component 240. While executing program code, processing component 222 can process data, which can result in reading and/or writing transformed data from/to storage component 240 and/or I/O component 226 for further processing. Pathway 228 provides a communications link between each of the components in computer system 202. I/O component 226 can comprise one or more human I/O devices, which enable a human user 210 (i.e., test operator) to interact with computer system 202 and/or one or more communications devices to enable a system user 210 to communicate with computer system 222 using any type of communications link. To this extent, testing program 230 can manage a set of interfaces (e.g., graphical user interface(s), application program interface, and/or the like) that enable human and/or system users 210 to interact with testing program 230. Further, testing program 230 can manage (e.g., store, retrieve, create, manipulate, organize, present, etc.) the data, such as signal data 250 (i.e., "BypassData," "TestSignal," "ReadClock" in FIGS. 2-4), using any solution.

In any event, computer system 202 can comprise one or more general purpose computing articles of manufacture (e.g., computing devices) capable of executing program code, such as testing program 230, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, testing program 230 can be embodied as any combination of system software and/or application software.

Further, testing program 230 can be implemented using a set of modules 232. In this case, a module 232 can enable computer system 202 to perform a set of tasks used by testing program 230, and can be separately developed and/or implemented apart from other portions of testing program 230. As used herein, the term "component" means any configuration of hardware, with or without software, which implements the functionality described in conjunction therewith using any solution, while the term "module" means program code that enables a computer system 202 to implement the actions described in conjunction therewith using any solution. When fixed in a storage component 240 of a computer system 202 that includes a processing component 222, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 202.

When computer system 202 comprises multiple computing devices, each computing device can have only a portion of testing program 230 fixed thereon (e.g., one or more modules 232). However, it is understood that computer system 202 and testing program 230 are only representative of various possible equivalent computer systems that may perform a process described herein. To this extent, in other embodiments, the functionality provided by computer system 202 and testing program 230 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 202 includes multiple computing devices, the computing devices can communicate over any type of communications link. Further, while performing a process described herein, computer system 202 can communicate with one or more other computer systems using any type of communications link. In either case, the communications link can comprise any combination of various types of optical fiber, wired, and/or wireless links; comprise any combination of one or more types of networks; and/or utilize any combination of various types of transmission techniques and protocols.

As discussed herein, testing program 230 enables computer system 202 to reduce unknown values from memory device 208 using bypass structure 225. To this extent, computer system 202 may perform the method according to aspects of the invention, as discussed herein with respect to FIGS. 2-5.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A bypass structure for a memory device, the bypass structure comprising:

a logic gate configured to receive a test signal and a clock signal; and an output latch configured to receive an output of the logic gate, an output of the memory device, and a bypass data signal, wherein the output latch is configured to hold the bypass data signal and bypass the output of the memory device in response to asserting the test signal, such that unknown data from the output of the memory device is bypassed.

2. The bypass structure of claim 1, wherein the output latch is configured to hold the bypass data signal in response to de-asserting the test signal, until the clock signal is asserted during a valid read of the memory device.

3. The bypass structure of claim 2, wherein, during the valid read of the memory device, the output of the memory device generates known data.

4. The bypass structure of claim 3, wherein, during the valid read of the memory device, the output of the memory device is passed through the output latch.

5. The bypass structure of claim 1, wherein the output latch drives a data transition to downstream logic.

6. The bypass structure of claim 1, wherein the output latch includes a multiplexer and a downstream latch.

7. The bypass structure of claim 1, wherein the output latch includes a two-port latch.

8. A circuit, comprising:

a memory device; and a bypass structure downstream of the memory device, the bypass structure comprising:

a logic gate configured to receive a test signal and a clock signal; and an output latch configured to receive an output of the logic gate, an output of the memory device, and a bypass data signal, wherein the output latch is configured to hold the bypass data signal and bypass the output of the memory device in response to asserting the test signal, such that unknown data from the output of the memory device is bypassed.

9. The circuit of claim 8, wherein the output latch is configured to hold the bypass data signal in response to de-asserting the test signal, until the clock signal is asserted during a valid read of the memory device.

10. The circuit of claim 9, wherein, during the valid read of the memory device, the output of the memory device generates known data.

11. The circuit of claim 10, wherein, during the valid read of the memory device, the output of the memory device is passed through the output latch.

12. The circuit of claim 8, wherein the output latch drives a data transition to downstream logic.

13. The circuit of claim 8, wherein the output latch includes a multiplexer and a downstream latch.

14. The circuit of claim 8, wherein the output latch includes a two-port latch.

15. A method of reducing unknown data from a memory device, the method comprising:

providing a memory device and a downstream bypass structure, the bypass structure comprising:

a logic gate configured to receive a test signal and a clock signal; and an output latch configured to receive an output of the logic gate, an output of the memory device, and a bypass data signal;

asserting the test signal, such that the output latch bypasses the output of the memory device and holds the bypass data signal; and de-asserting the test signal, such that the output latch continues to hold the bypass data signal.

16. The method of claim 15, further comprising writing known data into the memory device.

17. The method of claim 16, further comprising reading the known data from the memory device.

18. The method of claim 17, further comprising asserting the clock signal during the reading of the memory device, such that the output latch holds the known data from the output of the memory device.

19. The method of claim 15, wherein the output latch includes a multiplexer and a downstream latch.

20. The method of claim 15, wherein the output latch includes a two-port latch.

* * * * *